United States Patent [19]
Rose et al.

[11] Patent Number: 5,541,869
[45] Date of Patent: Jul. 30, 1996

[54] RESISTIVE MEMORY ELEMENT

[75] Inventors: Mervyn J. Rose, Angus; Janos Hajto, Edinburgh; Alan E. Owen, Edinburgh; Ian S. Osborne, Dundee; Anthony J. Snell, Midlothian; Peter G. Le Comber, deceased, late of Dundee, all of United Kingdom, by Joy Le Comber, legal representative

[73] Assignee: British Telecommunications, plc, London, England

[21] Appl. No.: 211,844

[22] PCT Filed: Oct. 20, 1992

[86] PCT No.: PCT/GB92/01929

§ 371 Date: Sep. 19, 1994

§ 102(e) Date: Sep. 19, 1994

[87] PCT Pub. No.: WO93/08575

PCT Pub. Date: Apr. 29, 1993

[30] Foreign Application Priority Data

Oct. 22, 1991 [GB] United Kingdom ............ 9122362

[51] Int. Cl.$^6$ ............................. G06F 15/80; G11C 27/00
[52] U.S. Cl. .................. 365/100; 365/46; 365/148
[58] Field of Search ........................ 365/100, 46, 148

[56] References Cited

U.S. PATENT DOCUMENTS 4,876,668  10/1989  Thakoor et al. ................. 365/163
4,931,763  6/1990  Ramesham et al. ............... 338/225 D
5,335,219  8/1994  Ovshinsky et al. ............... 365/113
5,406,509  4/1995  Ovshinsky et al. ............... 365/113
5,414,271  5/1995  Ovshinsky et al. ............... 257/3

FOREIGN PATENT DOCUMENTS 0382230  8/1990  European Pat. Off. .

OTHER PUBLICATIONS

Electronic Letters, vol. 24, No. 19, 15 Sep. 1988, Shimabukuro et al., "Dual–Plurality Nonvolatile MOS Analog Memory (MAM) Cell For Neural–Type Circuitry", pp. 1231–1232.

*Primary Examiner*—Viet Q. Nguyen
*Attorney, Agent, or Firm*—Nixon & Vanderhye

[57] ABSTRACT

The resistance of a resistive memory element, e.g. a synaptic element is programmed, e.g. adjusted to a target value, by pulses of a constant height and variable width. One polarity gives an increase in resistance; the other polarity gives a decrease. A short pulse applied after a longer pulse appears to have no effect. After each polarity change short pulses can again be used to make small adjustments. In a preferred embodiment longer and longer pulses are used until the resistance overshoots the target value. After overshooting the polarity is reversed and a second series of pulses is used to obtain a closer approach to the target. The resistive element comprises a resistive layer located between two electrodes, e.g. a matrix of amorphous silicon doped with boron containing V. One electrode is Cr and the other is V.

11 Claims, 1 Drawing Sheet

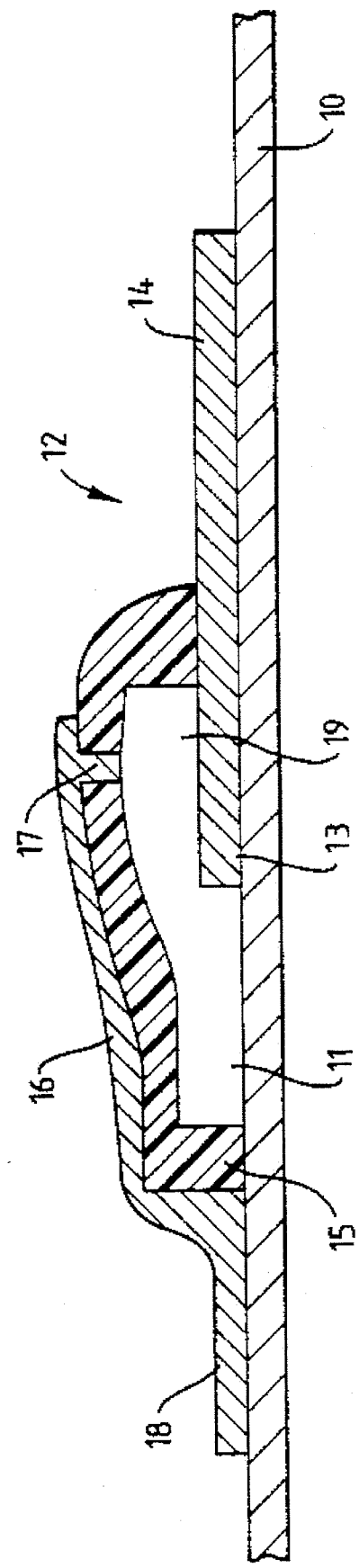

RESISTIVE MEMORY ELEMENT

BACKGROUND

1. Field of the Invention

This invention relates to resistive memory elements suitable for use as synaptic elements in neural networks.

2. Related Art and Other Considerations

Resistive memory elements usually take the form of a resistive layer which is located between two electrodes, e.g. metallic electrodes, which give access to the element. The resistive layer is usually formed of a host material, e.g. amorphous silicon, which contains a dopant to improve its host properties. In addition, the memory element includes an active species which plays a substantial part in the conduction of an electric current and adjusts the resistance of the resistive layer. The active species is usually a metal dispersed in the host as small particles or as atoms.

(Synaptic elements are usually configured as arrays in which many elements, e.g. $10^3$–$10^8$, are supported on a single substrate. The substrate provides mechanical support for all of the elements, but the substrate has little or no effect upon the preformance of the elements.)

Each element may have its own separate electrodes, so that arrays can be connected into networks as desired. It is also possible that any one element may share one or both of its electrodes with other elements. This means that the elements are permanently connected into particular network patterns. Arrays of elements are conveniently manufactured by depositing the various layers on a suitable substrate. The layers may be patterned by using well established techniques such as masking and etching.

It has been mentioned above that the resistive layer is usually formed of a host material which includes an active species. The elements V, Co, Ni, Pd, Fe and Mn are particularly suitable as the active species for use with amorphous silicon as the host material. The active species is conveniently introduced into a memory element by making one electrode out of the active species and causing it to migrate into the host. The process of migration is "forming" and it comprises applying a high voltage, e.g. of the order 8–35 volts, for a short time, e.g. 200–1,000 ns. The forming process reduces the resistance of the element from a very high value (in practice an infinite value) to a value which is suitable for use in a neural network, e.g. to a value within the range $10^3$–$10^6$ Ω.

It is emphasized that forming introduce the active species into the host material to give an initial value to the resistance. After forming, the resistance can be adjusted to a target value, and it is possible for the resistance to be adjusted and readjusted many times during the life of an element. The resistance of the element is used as the memory parameter. Resistive elements are used as the programmable memories in neural networks. The circuitry of a neural network addresses a particular element by applying an address voltage to the element, whereby the resistance of the element produces a particular current.

It is important to recognize that each element has two threshold voltages. The lower threshold voltage represents the upper limit for the address voltage. In other words the element is addressed by applying a voltage less than the lower threshold voltage to it. The upper threshold voltage constitutes the value at which the forming process may occur. Thus a voltage in excess of the upper threshold voltage is normally applied to each element in order to form it and, thereafter it is undesirable to apply voltages above the upper threshold value. Voltages which lie between the upper and lower threshold values are conveniently called "programming" voltages because voltages in this range are utilized to adjust the resistance of the element. Since the resistance of the element constitutes the memory parameter, voltages between the upper and lower threshold values are utilized for a process equivalent to the storage of data. (The data stored in its synaptic elements is an important part of the program of a neural network.)

It has been proposed to adjust the resistance of a synaptic element by applying thereto a voltage the value of which is selected so as to produce the desired result. It has been found that this method is difficult to operate because it is difficult to ascertain the value required to achieve the desired result. It is an object of this invention to facilitate the adjustment of the resistance of a memory element to a target value.

SUMMARY this invention is based on the unexpected discovery that the resistance of an element can be adjusted to a target value by varying the time for which the voltage is applied (instead of varying the magnitude). Thus, the resistance of an element can be adjusted to a target value by selecting a suitable voltage and applying a pulse of an appropriate duration. Preferably, the duration of the pulse is between 10–1,000 ns. The polarity of the pulse is important in that one polarity causes a decrease in the value of the resistance, and the opposite polarity causes an increase in the value of the resistance.

It is possible to establish correlations between pulse duration and resistance values. Using such a correlation, a target value of resistance can be achieved by applying a pulse of the appropriate duration and polarity. However, the variability of the forming step makes it difficult to establish an accurate correlation which has wide, general applicability. This invention includes a preferred embodiment which allows pulse widths to be used for adjusting the resistance of a memory element, even when no accurate correlation is available.

The preferred embodiment of the invention is based upon the discovery that, when several pulses of different duration are applied to a memory element, the result is determined only by the longest pulse. Thus, when shorter pulses are applied after a longer pulse, the subsequent, shorter pulses produce no noticeable effect.

This observation gives rise to a preferred method.

(a) Depending on whether the resistance of the element is too high or too low, the appropriate polarity is selected.

(b) A series of pulses is applied. It is convenient to measure the resistance after each pulse. The series includes later pulses which have longer durations than earlier pulses. Preferably the duration of each pulse is greater than the duration of its predecessor.

(c) When the resistance of the element approximates or passes the target value, the series is terminated.

At the completion of step (c) the resistance may, fortuitously, be close enough to the target value to regard the adjustment as complete. Alternatively, the process will overshoot.

The overshoot cannot be corrected by continuing with the same polarity, but the following procedure enables a further adjustment to the value of the resistance to be made. The further procedure comprises repeating the (a), (b) and (c) given above, but selecting the reverse polarity in step (a). In addition smaller increments in pulse duration are preferably used during step (b) whereby a smaller overshoot, if any, results. This procedure can be repeated as often as desired using reverse polarity and smaller increments in pulse duration at each repetition. For example, in a first series of pulses, the pulse duration may be increased by a constant increments of 100 ns, e.g. pulses of 100 ns, 200 ns, 300 ns and so on are applied until the series overshoots the target value.

In the next series the reverse polarity is used and the pulse durations are increased by increments of 10 ns, e.g. pulse durations of 10 ns, 20 ns, 30 ns and so on would be appropriate. It will be appreciated that further sequences may be utilised, each being of opposite polarity to its predecessor and having a shorter pulse increment than its predecessor. It is suggested that, for most cases, increments of 10 nm will produce the target value as closely as desired.

BRIEF DESCRIPTION OF THE DRAWING

The invention will now be described by way of example with reference to the accompanying drawing which shows a single synaptic element which is assumed to be comprised in an array of similar elements (now shown in the drawing).

DETAILED DESCRIPTION OF THE DRAWING

The element shown in the FIGURE is mechanically supported on a substrate 10. Since many, e.g. $10^4$, other similar elements (not shown) are supported on the same substrate 10 it is important that the substrate has a high electrical resistance. A glass sheet is suitable but a sheet of silicon the surface of which has been oxidized to $SiO_2$ is preferred. The thickness of the substrate 10 is not of major importance provided it is capable of supporting the device.

The synaptic element comprises a metallic layer, generally indicated by the numeral 12. Layer 12 is conveniently 50 to 100 nm thick and Cr is a suitable metal. The host material 11, e.g. amorphous silicon doped with a small amount of boron, is also supported on the substrate 10 but the host material partially overlaps and is in electrical contact with part of the metallic layer 12. Thus the layer 12 comprises two functional regions; namely a first electrode 13 in contact with host material 11 and first contact 14 to which external electrical leads may be attached.

The host material 11 is surrounded by an insulating matrix 15. A second metallic region 16 overlays the insulating matrix 15. Preferably the second metallic region 16 is vanadium and it is 40–70 nm thick. As an alternative to the preferred metal (V) other metals, e.g. Co, Ni, Pd, Fe and Mn also give very good results. The second metallic region 16 includes a cap electrode 17 and a second contact region 18, which is in mechanical contact with the substance 10. The cap electrode 17 passes through an aperture in the insulating matrix 15 to make electrical contact with the host material 11. The size and location of this aperture defines the electrode 17. There is a region 19 of the host material 11 which is located between the cap electrode 17 and the first electrode 13. The region 19 predominates in the passage of an electric current through the synaptic element. Forming and programming probably affect the properties of the region 19.

In use, e.g. when the element is connected into a neural network, external connectors are attached to the contacts 14 and 18 whereby the host material, and preferably its region 19, are incorporated into an external circuit.

One method of producing an array of synaptic elements, each as shown in the FIGURE will now be described by way of example.

First, a uniform metallic layer was deposited onto the substrate 10 using an evaporative technique. The uniform layer was etched, using conventional mask techniques, into the metallic sheet 12. Host material was deposited, using plasma enhanced chemical vapour deposition at 220°–300°, to give a complete layer preferably 60–150 nm thick. Using conventional masks and etching the complete layer as divided into the individual synaptic elements 11.

Next, an insulating layer was applied over the whole substrate, including the host regions 11 and the first electrodes 13. Unwanted insulating material was removed using conventional masking and etching techniques. Thus the insulating material between the elements was removed and the first contacts 14 were exposed. The substrate between the individual elements was also exposed.

A significant feature of the etching is that an aperture (in the insulating material) was created on top of each host region 11. This aperture is important because it defined accurately the position and size of the cap electrode 17. The etching of the insulating layer is a convenient way of providing accurate apertures.

Finally, an overall second metallic layer was deposited and etched to give the cap electrode 17 and the second contact region 18. The second metallic layer filled the apertures in the insulating layer so that size and location of the cap electrode 17 was accurately defined by the apertures. Etching the second metallic layer completes this part of the process and gives elements as shown in the FIGURE.

After the depositions and shapings were complete, the preparation of the synaptic element was completed by "forming". Forming comprised: applying a voltage of +16 volts for 300 ns to cap electrode 17. The application of this voltage caused the resistance of the element to drop from a very high, effectively infinite value, to a lower value within the range 1–2,000 k$\Omega$. The forming process renders the element usable as a resistive synaptic element, but the resistance thereof needs to be adjusted to a target value, and this can be done by applying programming voltages to control the resistance as necessary. It is interesting to note that the forming pulse had positive polarity, and it caused a reduction in the resistance. After the forming pulse has been applied, a positive voltage will tend to increase the resistance of the element and a negative voltage will tend to cause a decrease. That is, after forming, the effect of polarity is reversed.

It should be noted that forming leaves the resistance at an arbitrary value. There are three ways of dealing with this circumstance.

(a) Applying a long negative pulse, e.g. −3v for 10 μs, to adjust the resistance to a low value. Thus first programming will always need to increase a low initial value to a higher target value.

(b) apply a long positive pulse, e.g. +3V for 10 μs, to adjust the resistance to a high value. Thus first programming will always need to reduce a high initial value to a lower target value.

(c) Take no preliminary action to adjust the initial value of resistance which occurs after forming. This means that the resistance value at first programming is arbitrary and it is necessary to measure the resistance value in order to decide which polarity to use for the first programming.

Although it has been experimentally demonstrated that the forming and programming processes create the resistance as appropriate, these processes are not fully understood. It is believed that forming transfers some material from the electrode 17 into the region 19, whereby the transferred material acts as an active species for the conduction of an electric current through the element. According to this hypothesis, the programming voltages affect the distribution and/or the concentration of the active species whereby the resistance of the element is affected. Whatever the explanation, it has been experimentally observed that the application of pulses in accordance with the invention adjusts the resistance of the element to a target value.

In this specification voltages are specified as applied to electrode 17 with electrode 13 as the zero reference. The forming was achieved with +16 volts.

Tables 1, 2, 3 and 4 below illustrate the effect produced by pulses of varying duration on three synaptic elements made as described above. In all cases procedure (a) was adopted, i.e. after forming the resistance was adjusted to a low value whereby programming was required to increase the value of the resistance.

TABLE 1

Pulse Height +2.6 V

| PULSE NUMBER | PULSE DURATION ns | RESISTANCE kΩ |
|---|---|---|
| 1. | 10 | 4.57 |
| 2. | 20 | 10 |
| 3. | 50 | 26.3 |
| 4. | 100 | 56.2 |
| 5. | 200 | 121 |
| 6. | 600 | 398 |
| 7. | 1000 | 660 |
| 8. | 2000 | 1380 |

TABLE 2

Pulse height +2.4 V

| PULSE NUMBER | PULSE DURATION ns | RESISTANCE kΩ |
|---|---|---|
| 1. | 10 | 2.75 |
| 2. | 20 | 4.75 |
| 3. | 50 | 13.1 |
| 4. | 100 | 27.5 |
| 5. | 200 | 56.2 |
| 6. | 600 | 178 |
| 7. | 1000 | 316 |
| 8. | 2000 | 630 |
| 9. | 5000 | 1780 |

TABLE 3

Pulse Height +2.13 V

| PULSE NO. | PULSE DURATION ns | RESISTANCE kΩ |
|---|---|---|
| 1. | 10 | 2.5 |
| 2. | 20 | 2.5 |
| 3. | 30 | 3.23 |
| 4. | 50 | 4.78 |
| 5. | 100 | 9.55 |
| 6. | 200 | 21.37 |
| 7. | 400 | 46.6 |
| 8. | 600 | 72.4 |
| 9. | 1000 | 120 |
| 10. | 2000 | 263 |
| 11. | 4000 | 562 |
| 12. | 10000 | 1320 |

It will be noted that pulse 4 of Table 1 had a duration of 100 ns and it gave a resistance of 56.2 kΩ. Pulse 2 preceded pulse 4, the duration of pulse 2 was 20 ns and it gave a resistance of 10 kΩ. If a pulse of 20 ns were applied after pulse 4, the resistance would remain at 56.2 kΩ, i.e. the shorter pulse would have no effect. It will also be noted that pulse 7 of Table 1 had a duration of 1,000 ns and it gave a result of 660 kΩ. If a pulse of 1,000 ns had been applied immediately after forming, i.e. if pulses 1–6 had been omitted, the result would still have been 660 kΩ. This emphasises that it is only the duration of the longest pulse which is significant. The shorter pulses, whether applied before or after, have little or no effect.

It is emphasised that if the figures given in Table 1, 2 and 3 constituted a reliable correlation, the pulse duration needed to produce any target value could be selected and applied. However, it is very difficult to establish reliable correlations, so an alternative technique, illustrated in FIG. 4 is preferred.

TABLE 4

Target Value 200 kΩ

| PULSE NUMBER | PULSE VOLTAGE | PULSE DURATION ns | RESISTANCE kΩ |
|---|---|---|---|
| 1. | +2.6 | 100 | 54 |
| 2. | +2.6 | 200 | 115 |
| 3. | +2.6 | 300 | 185 |
| 4. | +2.6 | 400 | 230 |
| 5. | −2.6 | 10 | 221 |
| 6. | −2.6 | 20 | 217 |
| 7. | −2.6 | 30 | 210 |
| 8. | −2.6 | 40 | 206 |
| 9. | −2.6 | 50 | 198 |

Table 4 illustrates a procedure for increasing an initial low resistance to a target value of 200 kΩ.

Pulses 1 to 4 use the positive polarity to increase the resistance. After pulse 3 the resistance is too low at 185 kΩ so pulse 4 is applied which makes the resistance too high at 230 kΩ. Therefore the polarity is reversed and shorter pulses are applied to reduce the resistance. After pule 9 the resistance is 198 kΩ and an error of 2 kΩ is regarded as acceptable. If greater accuracy were required the polarity would be reversed (i.e. back to positive) and even shorter increments used.

We claim:

1. A method of adjusting the resistance of a resistive memory element to a target value wherein said resistive memory element comprises a resistive layer located between two metallic electrodes and said resistive layer is formed of a host material which contains an active species which plays a substantial part in the conduction of an electric current and adjusts the resistance of the resistive layer; characterised in that the method comprises:

(a) establishing a correlation between the duration of a pulse applied either to similar elements or to the same element and the resistance of the element after a pulse of said duration has been applied, (b) utilizing said correlation to determine the duration of pulse appropriate for producing the target value, and (c) applying a pulse of the duration specified by said correlation to produce said target value.

2. A method of adjusting the resistance of a resistive memory element to a target value wherein said resistive memory element comprises a resistive layer located between two metallic electrodes and said resistive layer is formed of a host material which contains an active species which plays a substantial part in the conduction of an electric current and adjusts the resistance of the resistive layer; which method comprises selecting a polarity adapted to cause the resistance to move towards the desired target value and applying a plurality of pulses of said polarity to said element wherein a later pulse has a greater duration than an earlier pulse, whereby the resistance of the element is caused to move towards said target value and wherein the application of said pulses is terminated when the resistance of the element becomes equal to or overshoots the target value.

3. A method according to claim 2, wherein the plurality of pulses constitutes a sequence in which the duration of each pulse is greater the duration of its immediate predecessor.

4. A method according to claim 2, wherein the pulses have the same polarity and substantially the same voltage but differing durations.

5. A method according to claim 2, which comprises a first treatment of electrical pulses at a first polarity followed by a second treatment of electrical pulses at the reverse polarity; said second treatment utilizing smaller increments of duration whereby the resistance is moved more slowly in the second treatment than in the first treatment so that a better approximation to the target value is achieved in the second treatment than in the first treatment.

6. A method according to claim 1, wherein the active species is a metal dispersed in the host material either as small particles or atoms.

7. A method according to claim 6, wherein the active species is formed of a same metal as one electrode.

8. A method according to claim 7, wherein the host material is amorphous silicon or doped amorphous silicon and the one electrode and the active species are selected from V, Co, Ni, Pd, Fe and Mn.

9. A method according to claim 3, wherein the pulses have the same polarity and substantially the same voltage but differing durations.

10. A method according to claim 3, which comprises a first treatment of electrical pulses at a first polarity followed by a second treatment of electrical pulses at the reverse polarity; said second treatment utilizing smaller increments of duration whereby the resistance is moved more slowly in the second treatment than in the first treatment so that a better approximation to the target value is achieved in the second treatment than in the first treatment.

11. A method according to claim 4, which comprises a first treatment of electrical pulses at a first polarity followed by a second treatment of electrical pulses at the reverse polarity; said second treatment utilizing smaller increments of duration whereby the resistance is moved more slowly in the second treatment than in the first treatment so that a better approximation to the target value is achieved in the second treatment than in the first treatment.

* * * * *